United States Patent
Karasawa et al.

(10) Patent No.: US 6,791,147 B1
(45) Date of Patent: Sep. 14, 2004

(54) SEMICONDUCTOR MEMORY DEVICE AND METHOD FOR MANUFACTURING THE SAME

(75) Inventors: Junichi Karasawa, Tatsuno-machi (JP); Kunio Watanabe, Sakata (JP); Takeshi Kumagai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/431,762

(22) Filed: Nov. 1, 1999

(30) Foreign Application Priority Data

Nov. 2, 1998  (JP) .......................................... 10-327461

(51) Int. Cl.[7] .............................................. H01L 29/76
(52) U.S. Cl. ...................................... 257/371; 257/372
(58) Field of Search ................................ 257/371, 372, 257/345, 394; 438/223, 224, 227, 228

(56) References Cited

U.S. PATENT DOCUMENTS

| | | | | |
|---|---|---|---|---|
| 4,907,058 A | * | 3/1990 | Sakai ........................... 357/42 |
| 5,043,788 A | * | 8/1991 | Omoto et al. |
| 5,428,239 A | * | 6/1995 | Okumura et al. |
| 5,455,438 A | * | 10/1995 | Hashimoto et al. ......... 257/391 |
| 5,654,577 A | * | 8/1997 | Nakamura et al. |
| 5,786,245 A | * | 7/1998 | Lien ........................... 438/197 |
| 5,814,866 A | * | 9/1998 | Borland ...................... 257/369 |
| 5,831,313 A | * | 11/1998 | Han et al. .................... 257/371 |
| 5,927,991 A | | 7/1999 | Lee |
| 5,945,715 A | | 8/1999 | Kuriyama |
| 6,043,123 A | * | 3/2000 | Wang et al. ................. 438/258 |
| 6,066,522 A | * | 5/2000 | Hirase ......................... 438/228 |
| 6,281,088 B1 | * | 8/2001 | Kim |

FOREIGN PATENT DOCUMENTS

| | | |
|---|---|---|
| JP | 04-012565 | 1/1992 |
| JP | 08-330528 | 12/1996 |
| JP | 09-129743 | 5/1997 |
| JP | 09-199612 | 7/1997 |

* cited by examiner

Primary Examiner—Tom Thomas
Assistant Examiner—Eugene Lee
(74) Attorney, Agent, or Firm—Hogan & Hartson, LLP

(57) ABSTRACT

A semiconductor memory device has a peripheral circuit area and a memory cell area on a main surface thereof. The semiconductor memory device includes a first well formed in the peripheral circuit area, a second well of a first conductivity type formed in the memory cell area, a third well of a second conductivity type formed in the memory cell area, and a device isolation structure formed in the memory cell area for isolating an element formed in the second well from an element formed in the third well. The second well of the first conductivity type has a depth shallower than a depth of the first well. The third well of the second conductivity type is equal in depth to the second well. The second and third wells are formed down to a level lower than the device isolation structure.

15 Claims, 18 Drawing Sheets

SEMICONDUCTOR MEMORY DEVICE AND METHOD FOR MANUFACTURING THE SAME

BACKGROUND OF THE INVENTION

1. Field of the Invention

The present invention relates to a semiconductor memory device having twin wells and a manufacturing method thereof.

2. Description of Related Art

There are a variety of different types of SRAMs, one form of semiconductor memory devices. One type of SRAMs employs CMOS devices. Among CMOS devices, twin-well type devices are mainstream devices. A twin-well type device has a p-well and an n-well that are formed in a semiconductor substrate. For example, Japanese Unexamined Patent Publication No. 8-330528 describes an SRAM employing twin wells. FIG. 18 is a cross-sectional view showing a memory cell-area and a peripheral circuit area of the SRAM described in the publication.

The construction of the memory cell area is discussed first. A semi-recessed LOCOS oxidation layer 204 is formed on the main surface of a silicon substrate 200. A p-well 202 is formed over the entire surface of the main surface of the silicon substrate 200. The p-well 202 extends to a level deeper than the semi-recessed LOCOS oxidation layer 204.

An n-well 206 is formed in a predetermined area of the p-well 202. The n-well 206 is formed at a level shallower than the semi-recessed LOCOS oxidation layer 204. A p-channel transistor 208 having a pair of p-type source/drains 210 is formed in the n-well 206.

An n-channel transistor 214 having a pair of n-type source/drains 212 is formed in a predetermined area of the p-well 202. The n-channel transistor 214 is isolated from the p-channel transistor 208 by the semi-recessed LOCOS oxidation layer 204.

The construction of the peripheral circuit area is now discussed. A semi-recessed LOCOS oxidation layer 216 is formed on the main surface of the silicon substrate 200. A p-well 218 and an n-well 220 are formed on the main surface of the silicon substrate 200. The border between the p-well 218 and the n-well 220 is present beneath the semi-recessed LOCOS oxidation layer 216. The depths of the p-well 218 and the n-well 220 are generally equal to the depth of the p-well 202.

A p-channel transistor 224 having a pair of p-type source/drains 222 is formed in the n-well 220. A n-channel transistor 228 having a pair of n-type source/drains 226 is formed in the p-well 218.

To miniaturize memory cells, the length of the device isolation structure (such as a semi-recessed LOCOS oxidation layer) of the memory cell area needs to be shortened. To prevent the generation of a substrate current that causes latchup, the spacing between one well and the source/drain of another well formed adjacent to the one well needs to be longer than a certain distance.

In the technique discussed in the above publication, the n-well 206 is formed at a level shallower than the semi-recessed LOCOS oxidation layer 204. This arrangement prevents the distance between the n-well 206 and the n-type source/drain 212 from becoming too short while providing the semi-recessed LOCOS oxidation layer 204 with an adequate length.

In the technique disclosed in the publication described above, however, the depth of the p-well 202 is different from the depth of the n-well 206. This arrangement creates a difference in performance between the n-channel transistor 214 and the p-channel transistor 208. This leads to an imbalance between the n-channel transistor 214 and the p-channel transistor 208, degrading a state-sustaining function of each flip-flop in the SRAM.

Furthermore, the p-type source/drain 210 is formed in the n-well 206, and the n-well 206 is formed at a level shallower than the semi-recessed LOCOS oxidation layer 204. Accordingly, this arrangement leads to a problem as to how a well contact region that connects to a wiring for fixing the potential of the n-well 206 is formed. Forming the well contract region in each cell is contemplated. However, such a construction increases the cell size.

A shallow n-well 206 requires that the p-type source/drain 210 be formed at a considerably shallower level. The drain current of the p-channel transistor 208 is substantially smaller than the drain current of the n-channel transistor 214. When an operating voltage is high, this is not a problem. However, the operating voltage is lowered as the SRAM is miniaturized. For example, when the p-channel transistor 208 is operated from 2 V, there is fear that a small current causes the p-channel transistor 208 to be unable to achieve its required performance.

SUMMARY OF THE INVENTION

The present invention has been developed to solve the above-described problems. It is an object of the present invention to provide a semiconductor memory device and a manufacturing method thereof, which prevents the distance between one well and the source/drain of another well form-ed adjacent to the one well from becoming too short without increasing the length of the device isolation structure.

In accordance with one embodiment of the present invention, a semiconductor memory device has a peripheral circuit area and a memory cell area on a main surface thereof. The semiconductor memory device may include a first well formed in the peripheral circuit area, a second well of a first conductivity type formed in the memory cell area, a third well of a second conductivity type formed in the memory cell area, and a device isolation structure formed in the memory cell area for isolating an element formed in the second well from an element formed in the third well. In one feature of the embodiment, the second well of the first conductivity type has a depth shallower than a depth of the first well. The third well of the second conductivity type is generally equal in depth to the second well, wherein the second and third wells are formed down to a level lower than the device isolation structure.

In accordance with one embodiment of the present invention, the well in the peripheral circuit area and the wells in the memory cell area may be different in depth. In a preferred embodiment, the depths of the second and third wells formed in the memory cell area are shallower than that of the first well formed in the peripheral circuit area.

In accordance with one embodiment of the present invention, the second well and the third well beneath the device isolation structure may overlap with one another, and an overlapped area between the second well and the third well beneath the device isolation structure is reduced. The reason for this will be described in the discussion of the embodiments.

In one feature of an embodiment of the present invention, the distance between one well and the source/drain of another well formed adjacent to the one well is prevented from becoming too short without increasing the length of the device isolation structure.

Examples of the device isolation structure in the present invention include a LOCOS oxidation layer, a semi-recessed LOCOS oxidation layer, a shallow trench (as deep as 0.4 to 0.8 µm), and the like. The term "source/drain" refers to at least one of source and drain.

In accordance with one embodiment of the present invention, the second well and the third well may be equal in depth. This arrangement precludes an imbalance in performance between transistors attributable to a well depth difference in the memory cell area. It is noted that, in this specification, the term "equal depth" is not strictly limited to the same depth but also covers a well depth difference that causes substantially no imbalance in performance between transistors.

Since the second well and the third well may be equal in depth in accordance with embodiments of the present invention, the depth of the source/drain of the second well and the depth of the source/drain of the third well can be equalized to one another. This arrangement causes substantially no imbalance in performance between transistors, attributable to a depth difference between the sources/drains in the memory cell area.

In accordance with one embodiment of the present invention, the sources/drains formed in the second well and third well are prevented from becoming too shallow, compared to the source/drain formed in the first well.

The well contact region for fixing the well potential is formed isolated from the source/drain. In accordance with one embodiment of the present invention, the second and third wells are formed down to a level lower than the device isolation structure. With this arrangement, the wells can extend to the well contact region. The second and third wells are thus readily connected to the well contact regions.

In accordance with one embodiment of the present invention, the depths of the source/drain of a transistor formed in the first well, the depths of the source/drain of a transistor formed in the second well, and the depths of the source/drain of a transistor formed in the third well may preferably be equal to one another. With this arrangement, the sources/drains having the same conductivity type can be produced at the same time.

The first, second and third wells may preferably be retrograded wells in accordance with one embodiment of the present invention. The retrograded well refers to a well that is produced using a high-energy ion implantation, rather than thermal diffusion.

Each of the retrograded wells, i.e., the first, second and third wells, includes, in the order from above, a first-concentration layer, a second-concentration layer and a third-concentration layer. The first well may further include a fourth-concentration layer beneath the third-concentration layer. In one embodiment, in the first well, a channel doped layer for adjusting Vth of a transistor, for example, is the first-concentration layer; a punch-through stopper layer for controlling a short channel effect of the transistor, for example, is the second-concentration layer; a channel cut layer for restraining the operation of a parasitic transistor in the device isolation structure, for example, is the third-concentration layer; and a low-resistance layer for lowering the well resistance, for example, is the fourth-concentration layer. In the second and third wells, a channel doped layer, for example, is the first-concentration layer, a punch-through stopper layer, for example, is the second-concentration layer and a channel cut layer, for example, is the third-concentration layer.

In accordance with one embodiment of the present invention, a CMOS cell type SRAM is formed in the memory cell area. The CMOS cell type SRAM refers to an SRAM in which each cell is constructed of CMOS.

In accordance with embodiments of the present invention, the length of the device isolation structure in the memory cell area preferably falls within a range of about 0.2 µm to 1.6 µm. The border between the second well and the third well needs to be located beneath the device isolation structure. There is a possibility that a misalignment takes place when a resist is patterned. For this reason, the device isolation structure thus needs a minimum length. The minimum length of the structure is about 0.2 µm. If the length of the device isolation structure is longer than about 1.6 µm, the size of a memory cell becomes too large.

The depth of each of the second and third wells preferably falls within a range of about 0.5 µm to 1.2 µm in accordance with embodiments of the present invention. If the depths of the second and third wells are shallower than about 0.5 µm, the device isolation structure becomes deeper than the wells. There arises a problem as to how a well contact region for fixing the potential of the well is formed. If the depths of the second and third wells are deeper than about 1.2 µm, the overlapped area between the second well and the third well, beneath the device isolation structure, expands.

The first well may preferably include a first conductivity type well and a second conductivity type well, in other words, may preferably include twin wells.

When the first, second and third wells in the structure have their impurity concentrations varying in the direction of depth of the structure, the first well of the first conductivity type and the second well can be concurrently produced, and the first well of the second conductivity type and the third well can be concurrently produced. For example, in one embodiment, the first well may have four layers having four different impurity concentrations, and each of the second and third wells may have three layers of three different impurity concentrations. The fourth-concentration layer may be formed in each of the first wells of the first and second conductivity types. Each of the third-concentration layer, the second-concentration layer, and the first-concentration layer may be formed on the first well of the first conductivity type and the second well at the same time, and each of the third-concentration layer, the second-concentration layer, and the first-concentration layer may be formed on the first well of the second conductivity type and the third well at the same time.

In accordance with one embodiment of the present invention, a semiconductor memory device having a semiconductor substrate, a peripheral circuit area and a memory cell area on a main surface of the semiconductor substrate is manufactured by the following manufacturing method: (a) a device isolation structure is formed on the main surface of the semiconductor substrate; (b) a first well is formed by ion-implanting an impurity in the peripheral circuit area only; (c) a second well of a first conductivity type is formed by ion-implanting an impurity in the memory cell area, wherein the second well is shallower in depth than the first well and is formed down to a level lower than a device isolation structure; and (d) a third well of a second conductivity type is formed by ion-implanting an impurity in the memory cell area, wherein the third well is in contact with the second well beneath the device isolation structure and is generally equal in depth to the second well.

As a result, a semiconductor memory device prevents the distance between one well and the source/drain of another well adjacent to the one well from becoming too short without excessively elongating the device isolation structure.

In a preferred embodiment, step (b) may preferably use, as a mask, a resist pattern having a thickness within a range from about 3.0 µm to about 8.0 µm, and steps (c) and (d) may preferably use, as a mask, a resist pattern having a thickness within a range from about 1.2 µm to about 2.5 µm.

If the thickness of the resist pattern is thinner than about 3.0 µm in step (b), an impurity penetrates the resist pattern when ion implantation is performed to form a retrograded well. If the thickness of the resist pattern is thicker than about 8.0 µm, control of the configuration of the end portion of the resist pattern is difficult. As a result, the length of the device isolation structure needs to be increased.

If the thickness of the resist pattern is thinner than about 1.2 µm in steps (c) and (d), an impurity penetrates the resist pattern when ion implantation is performed to form a retrograded well. If the thickness of the resist pattern is thicker than about 2.5 µm, there arises a problem that the overlapped area between the second well and the third well, beneath the device isolation structure, expands.

Either a positive resist or a negative resist works as the resist pattern in step (b). A positive resist or a negative resist works as the resist pattern in steps (c) and (d) as well. However, more preferably, a positive resist is used in steps (c) and (d). This is because the positive resist outperforms the negative resist in the control of the vertical configuration of the end portion of the resist pattern and the dimensional control of the resist pattern.

The first well, constructed in accordance with the manufacturing method of the present invention, may preferably be composed of a first conductivity type well and a second conductivity type well, in other words, twin wells. Step (b) may include implanting ions in a formation area of the first conductivity type well and implanting ions in a formation area of the second conductivity type well.

Step (c) may include the step of implanting ions three times in the formation area of the second well and the formation area of the first conductivity type well in the peripheral circuit area. By the step of implanting ions three times, the second well has, in the order from below, a third-concentration layer, a second-concentration layer and a first-concentration layer formed in the memory cell area. By step (b) and the step of implanting ions three times, the first conductivity type well has, in the order from below, a fourth-concentration layer, a third-concentration layer, a second-concentration layer and a first-concentration layer formed in the peripheral circuit area.

Step (d) may include the step of implanting ions three times in the formation area of the third well and the formation area of the second conductivity type well in the peripheral circuit area. In the step of implanting ions three times, the third well has, in the order from below, a third-concentration layer, a second-concentration layer, and a first-concentration layer, is formed in the memory cell area. In step (b) and the step of implanting ions three times, the second conductivity type well has, in the order from below, a fourth-concentration layer, a third-concentration layer, a second-concentration layer, and a first-concentration layer, formed in the peripheral circuit area.

Other features and advantages of the invention will be apparent from the following detailed description, taken in conjunction with the accompanying drawings which illustrate, by way of example, various features of embodiments of the invention.

PREFERRED EMBODIMENTS

Figure 1:
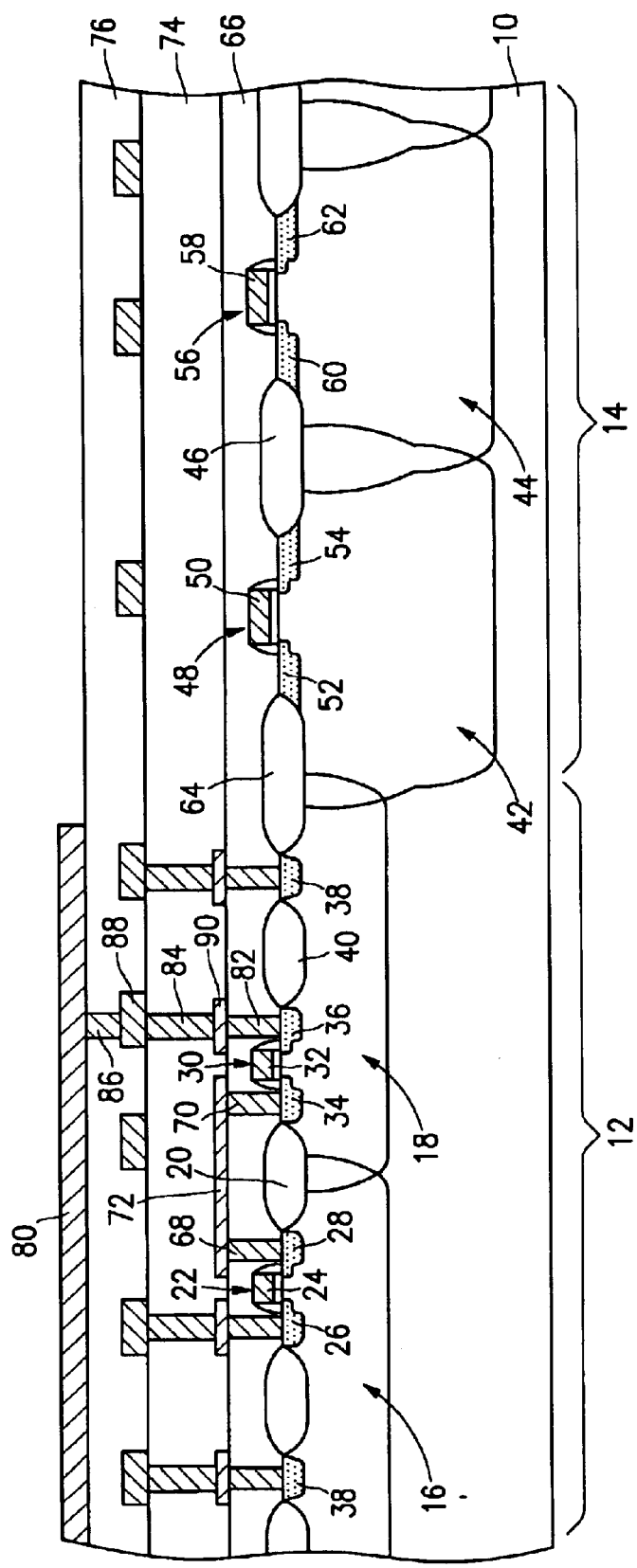
FIG. 1 is a cross-sectional view of a semiconductor memory device in accordance with one embodiment of the present invention.

FIG. 1 is a cross-sectional view of a semiconductor memory device in accordance with one embodiment of the present invention. The semiconductor memory device is an SRAM. Referring to FIG. 1, the main surface of a p-type silicon substrate 10, as one example of semiconductor substrate, is divided into a memory cell area 12 and a peripheral circuit area 14.

Formed in the memory cell area 12 are an n-well 16 and a p-well 18. The n-well 16 and the p-well 18 are retrograded wells. The n-well 16 and the p-well 18 overlap each other in a border between the n-well 16 and the p-well 18. A semi-recessed LOCOS oxidation layer 20 is formed on the border.

A p-channel transistor 22 is formed in the n-well 16. The p-channel transistor 22 includes a gate electrode 24, a source 26 and a drain 28. An n-channel transistor 30 is formed in the p-well 18. The n-channel transistor 30 includes a gate electrode 32, a source 34 and a drain 36. A well contact region 38 is formed in the p-well 18. A wiring, for fixing the potential of the p-well 18, is connected to the well contact region 38. In this embodiment, the well contact region 38 is connected to a ground line. The well contact region 38 is isolated from the drain 36 by a semi-recessed LOCOS oxidation layer 40.

In the peripheral circuit area 14, an n-well 42 and a p-well 44 are formed adjacent to each other. The n-well 42 and the p-well 44 are retrograded wells. The n-well 42 and the p-well 44 overlap each other in a border between the n-well 42 and p-well 44. A semi-recessed LOCOS oxidation layer 46 is formed over the border.

A p-channel transistor 48 is formed in the n-well 42. The p-channel transistor 48 includes a gate electrode 50 and source/drain 52 and 54. An n-channel transistor 56 is formed in the p-well 44. The n-channel transistor 56 includes a gate electrode 58 and source/drain 60 and 62. A semi-recessed LOCOS oxidation layer 64 isolates the memory cell area 12 from the peripheral circuit area 14.

An interlayer dielectric layer 66 is formed over the main surface of the p-type silicon substrate 10 to cover the memory cell area 12 and the peripheral circuit area 14. Contact holes are formed in the interlayer dielectric layer 66 to expose the drain 28 and the source 34. The contact holes are filled with electrically conductive materials 68 and 70. A wiring layer 72 is formed on the interlayer dielectric layer 66. The drain 28 is connected to the source 34 through the wiring layer 72 and the electrically conductive materials 68 and 70.

An interlayer dielectric layer 74 is formed on the interlayer dielectric layer 66. A plurality of wiring layers are arranged on the interlayer dielectric layer 74. An interlayer dielectric layer 76 is formed on the interlayer dielectric layer 74 to cover these wiring layers. A bit line 80 is arranged on the interlayer dielectric layer 76. Contact holes are formed in interlayer dielectric layers 66, 74, and 76. The contact holes are filled with electrically conductive materials 82, 84, and 86. The bit line 80 is connected to the drain 36 through the electrically conductive material 86, a pad layer 88, the electrically conductive material 84, a pad layer 90 and the electrically conductive material 82.

Figure 2:
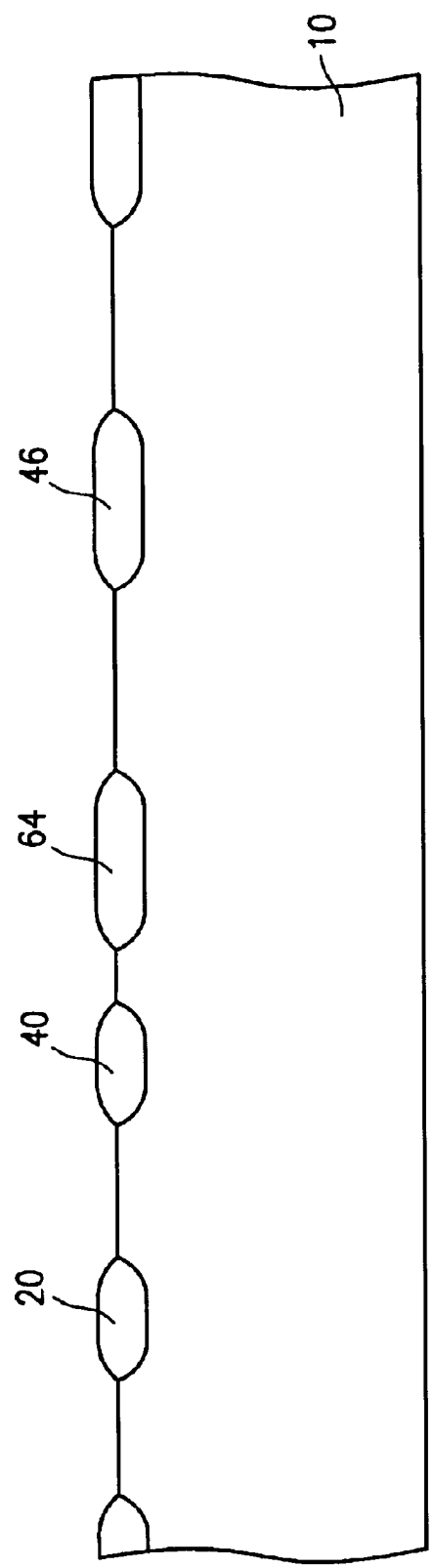
FIG. 2 is a cross-sectional view of the semiconductor memory device in a first manufacturing step in accordance with the embodiment of the present invention.

A method for manufacturing a semiconductor memory device in accordance with one embodiment of the present invention will be described below. Referring to FIG. 2, first, a plurality of trenches are formed in the main surface of the silicon substrate 10 which has an anti-oxidation layer, such as silicon nitride, formed thereon. Oxidation layers are formed in these trenches using the LOCOS technique. Semi-recessed LOCOS oxidation layers 20, 40, 46, and 64, each having a thickness in a range of about 0.2 $\mu$m to about 0.7 $\mu$m, are thus formed.

Figure 3:
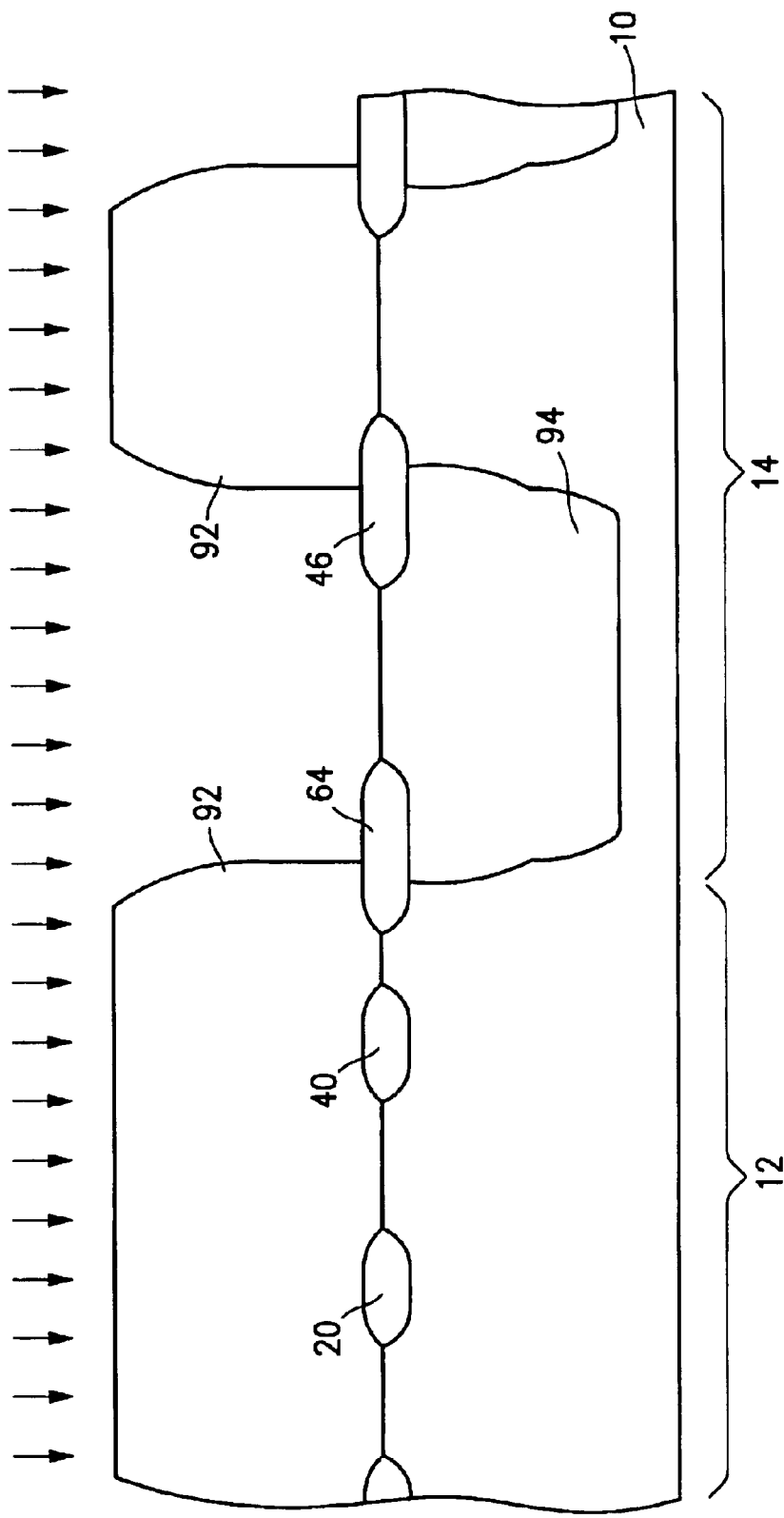
FIG. 3 is a cross-sectional view of the semiconductor memory device in a second manufacturing step in accordance with the embodiment of the present invention.

Referring to FIG. 3, a resist pattern 92 having a thickness in a range of about 3.0 $\mu$m to about 8.0 $\mu$m is formed such that an n-well formation area is opened in the peripheral circuit area 14. The silicon substrate 10 is implanted with phosphorus using the resist pattern 92 as a mask to form a low-resistance layer 94. The implantation energy ranges from about 500 KeV to about 3 MeV at a dose of about 5E12 to about 5E13.

Figure 4:
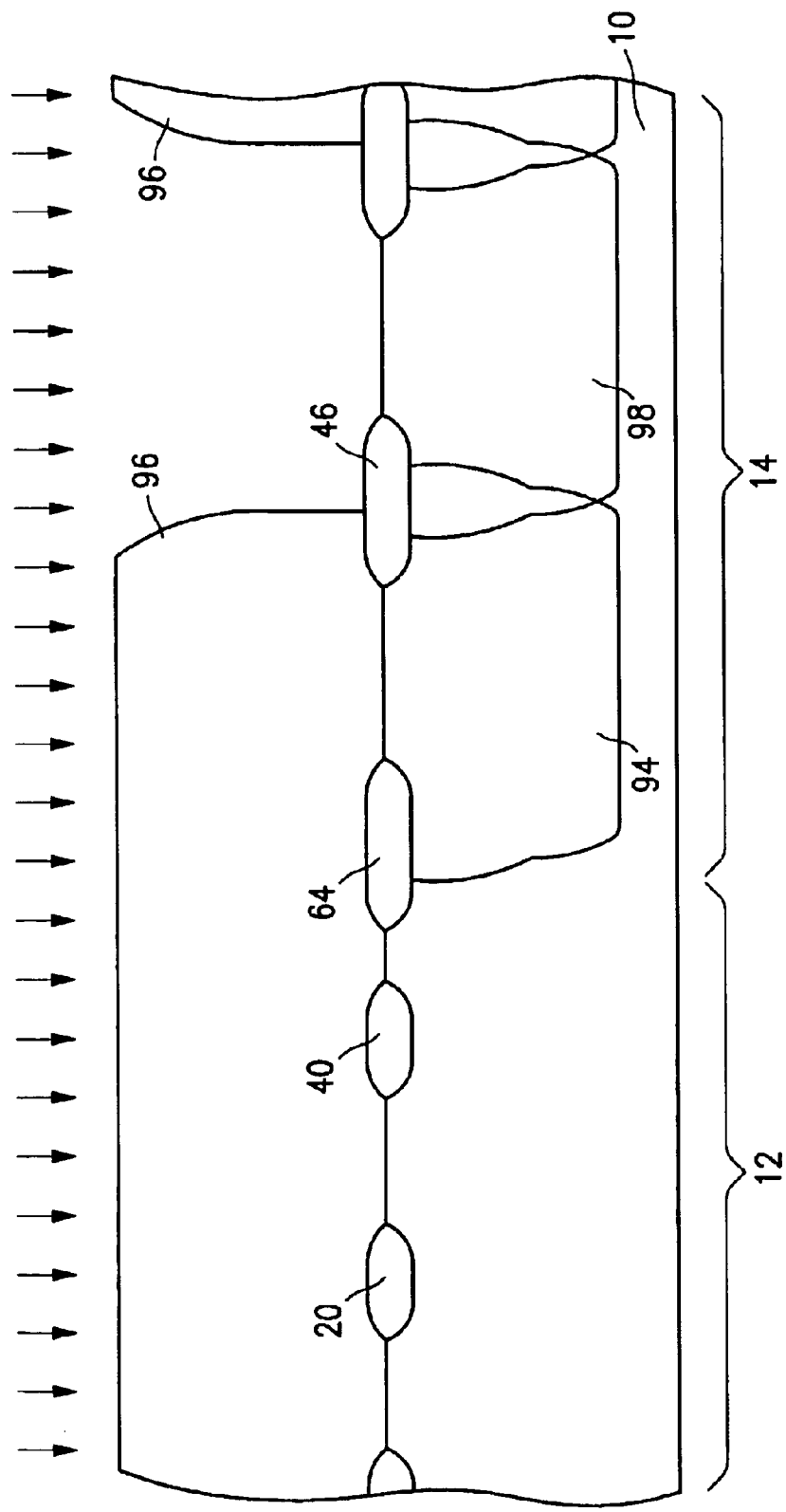
FIG. 4 is a cross-sectional view of the semiconductor memory device in a third manufacturing step in accordance with the embodiment of the present invention.

Referring to FIG. 4, a resist pattern 96 having a thickness in a range of about 3.0 $\mu$m to about 8.0 $\mu$m is formed such that a p-well formation area is opened in the peripheral circuit area 14. The silicon substrate 10 is implanted with boron using the resist pattern 96 as a mask to form a low-resistance layer 98. The implantation energy ranges from about 300 KeV to about 2 MeV at a dose of about 5E12 to about 5E13.

Figure 5:
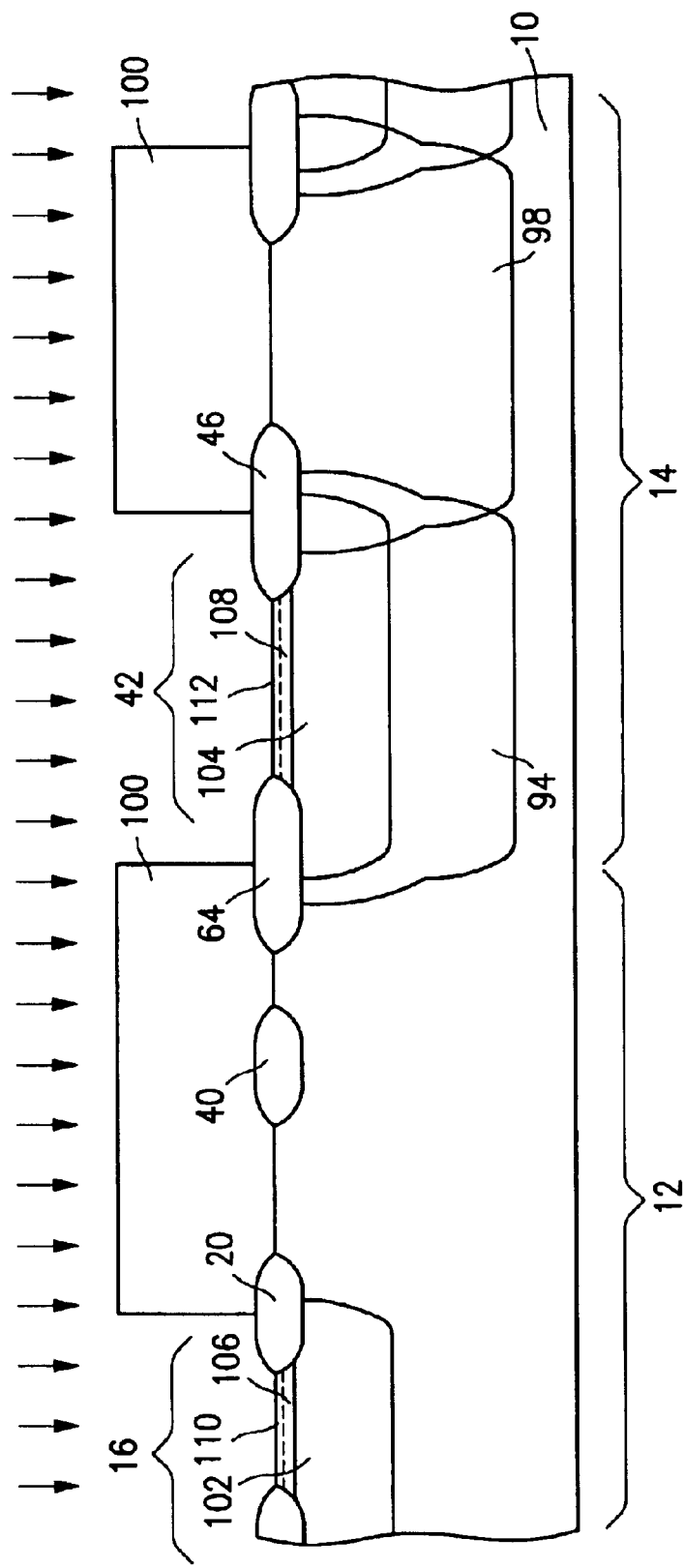
FIG. 5 is a cross-sectional view of the semiconductor memory device in a fourth manufacturing step in accordance with the embodiment of the present invention.

Referring to FIG. 5, a resist pattern 100 having a thickness in a range of about 1.2 $\mu$m to about 2.5 $\mu$m is formed such that n-well formation areas are opened in the memory cell area 12 and the peripheral circuit area 14. The silicon substrate 10 is implanted with phosphorus using the resist pattern 100 as a mask to form channel cut layers 102 and 104. The implantation energy ranges from about 200 KeV to about 500 KeV at a dose of about 3E12 to about 2E13.

The silicon substrate 10 is implanted with phosphorus with the resist pattern 100 as a mask to form punch-through stopper layers 106 and 108. The implantation energy ranges from about 100 KeV to, about 200 KeV at a dose of about 2E12 to about 1E13. Alternatively, the punch-through stopper layers 106 and 108 are formed using arsenic. The implantation energy in this case ranges from about 150 KeV to about 300 KeV at a dose of about 2E12 and about 1E13.

The silicon substrate 10 is implanted with ions using the resist pattern 100 as a mask to form channel doped layers 110 and 112. The channel doped layers 110 and 112 are formed by using any of the following implants (a), (b) and (c), alone or in combination:

(a) phosphorus, about 20 KeV to about 100 KeV, about 1E12 to about 1E13.

(b) boron difluoride, about 30 KeV to about 100 KeV, about 1E12 to about 1E13.

(c) boron, about 10 keV to about 50 keV, about 1E12 to about 1E13.

The above steps complete the formation of the n-well 16, including the channel cut layer 102, the punch-through stopper layer 106, and the channel doped layer 110 in the memory cell area 12. In the peripheral circuit area 14, the formation of the n-well 42, including the low-resistance layer 94, the channel cut layer 104, the punch-through stopper layer 108, and the channel doped layer 112, is completed.

Figure 6:
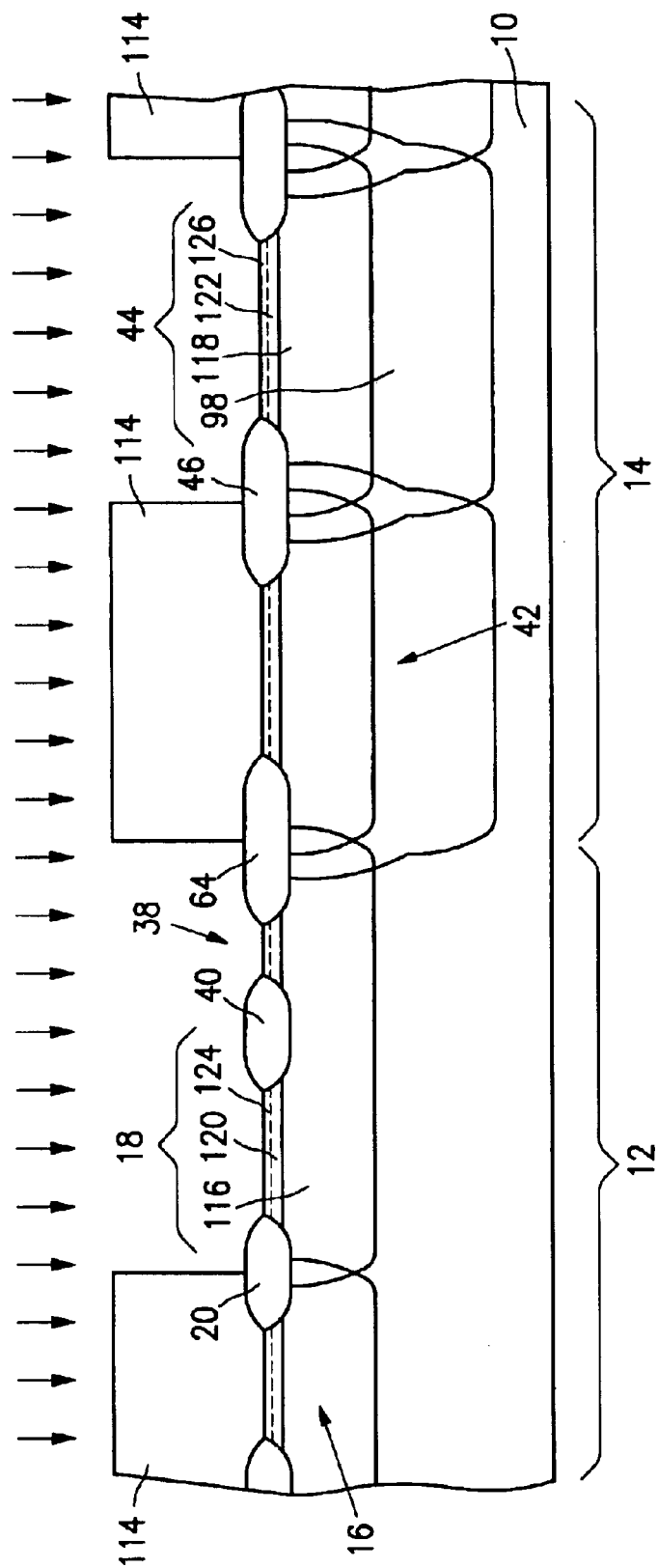
FIG. 6 is a cross-sectional view of the semiconductor memory device in a fifth manufacturing step in accordance with the embodiment of the present invention.

Referring to FIG. 6, a resist pattern 114, having a thickness in a range of about 1.2 $\mu$m to about 2.5 $\mu$m, is formed such that p-well formation areas are opened in the memory cell area 12 and the peripheral circuit area 14. The silicon substrate 10 is implanted with boron using the resist pattern 114 as a mask to form channel cut layers 116 and 118. The implantation energy ranges from about 100 KeV to about 300 KeV at a dose of about 3E12 to about 2E13.

The silicon substrate 10 is implanted with boron using the resist pattern 114 as a mask to form punch-through stopper layers 120 and 122. The implantation energy ranges from about 50 keV to about 200 keV at a dose of about 2E12 to about 1E13. The punch-through stopper layers 120 and 122 are respectively overlaid on the channel cut layers 116 and 118, depending on the implantation energy applied. In this case, a single ion implantation process can form a layer that simultaneously serves the purposes of the two layers.

The silicon substrate 10 is implanted with ions using the resist pattern 114 as a mask to form channel doped layers 124 and 126. The channel doped layers 124 and 126 are formed by using any of the following implants (a), (b), and (c), alone or in combination:

(a) phosphorus, about 20 KeV to about 100 KeV, about 1E12 to about 1E13.

(b) boron difluoride, about 30 KeV to about 150 KeV, about 1E12 to about 1E13.

(c) boron, about 10 keV to about 50 keV, about 1E12 to about 1E13.

The above steps complete the formation of the p-well 18, including the channel cut layer 116, the punch-through stopper layer 120 and the channel doped layer 124, in the memory cell area 12. In the peripheral circuit area 14, the formation of the p-well 44, including the low-resistance layer 98, the channel cut layer 118, the punch-through stopper layer 122 and the channel doped layer 126, is completed. In the p-well 18, the well contact region 38 is also formed through the ion implantation, which is also used to form the p-well 18.

The formation of the structure shown in FIG. 1 is completed using a standard process technology. Referring to FIG. 1, lines representing the channel cut layers 102, 104, 116, and 118, punch-through stopper layers 106, 108, 120, and 122, and channel doped layers 110, 112, 124, and 126 are not shown in FIG. 1.

The structure of the well of the semiconductor memory device of this embodiment is now discussed from the standpoint of concentration. The well formation conditions are represented by values listed in a deep well B column and a shallow well column in Table 1 to be discussed later.

Figure 10:
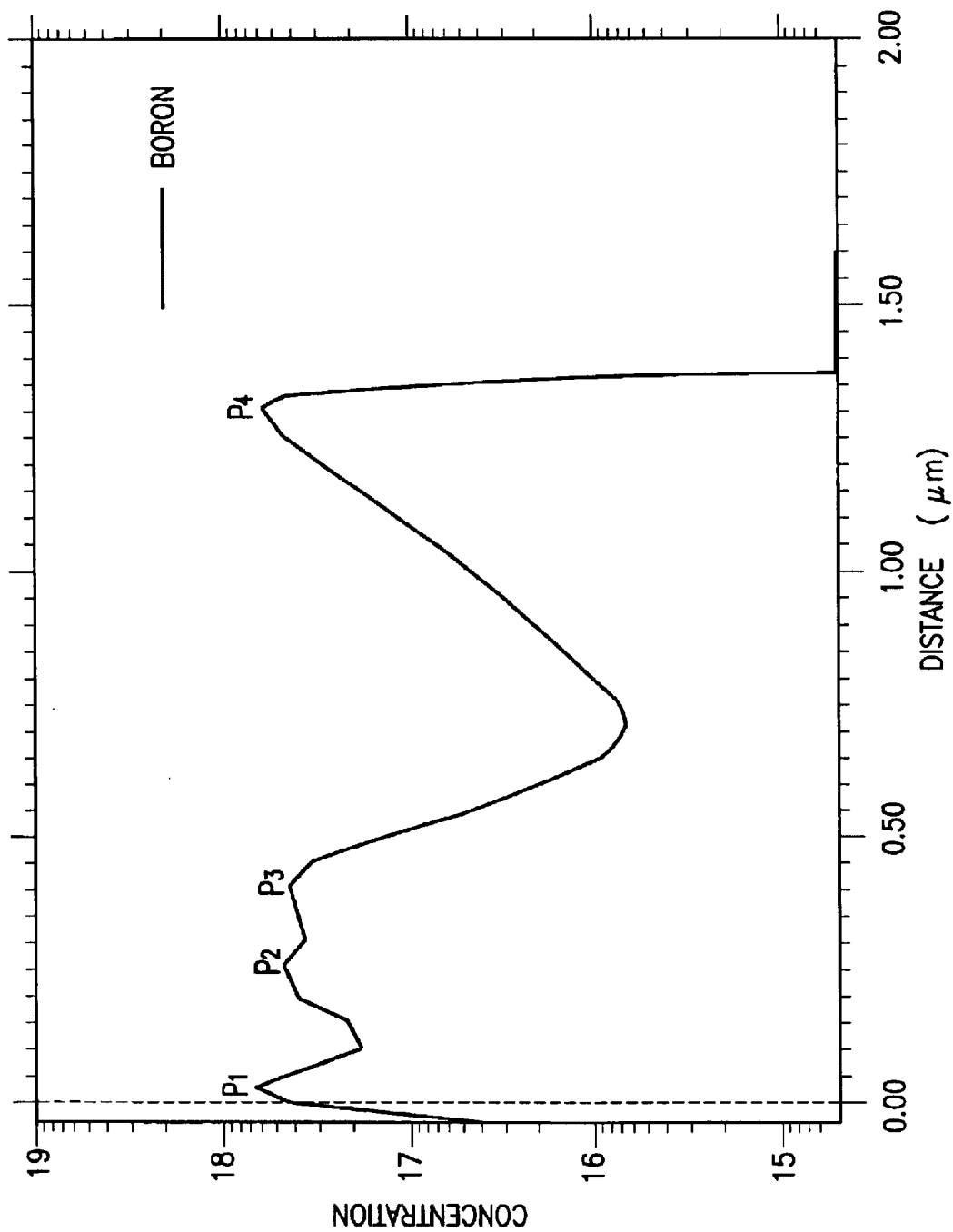
FIG. 10 is a graph showing an implant concentration in the well subsequent to a fourth ion implantation into a p-well in a peripheral circuit area.

FIG. 10 shows an implant concentration profile of the implant in the well subsequent to conducting a fourth ion implantation into the p-well formation area in the peripheral circuit area. The distance in FIG. 10 represents the depth of the well from the main surface of the silicon substrate. The concentration in FIG. 10 is represented in a logarithmic scale. For example, the value 17 represents $1 \times 10^{17}$ ions/cm$^3$.

In the peripheral circuit area, the p-well is formed by ion implantation that is conducted four times with different implantation energies and doses. There are four concentration peaks ($P_1$, $P_2$, $P_3$ and $P_4$) in the direction of the depth of the well. $P_1$ represents a channel doped layer, $P_2$ represents a punch-through stopper layer, $P_3$ represents a channel cut layer, and $P_4$ represents a low-resistance layer for lowering the resistance of the well. In the following discussion in conjunction with graphs, the distance, the concentration, and peaks ($P_1$, $P_2$, $P_3$ and $P_4$) remain unchanged in meaning from those in FIG. 10.

Figure 11:
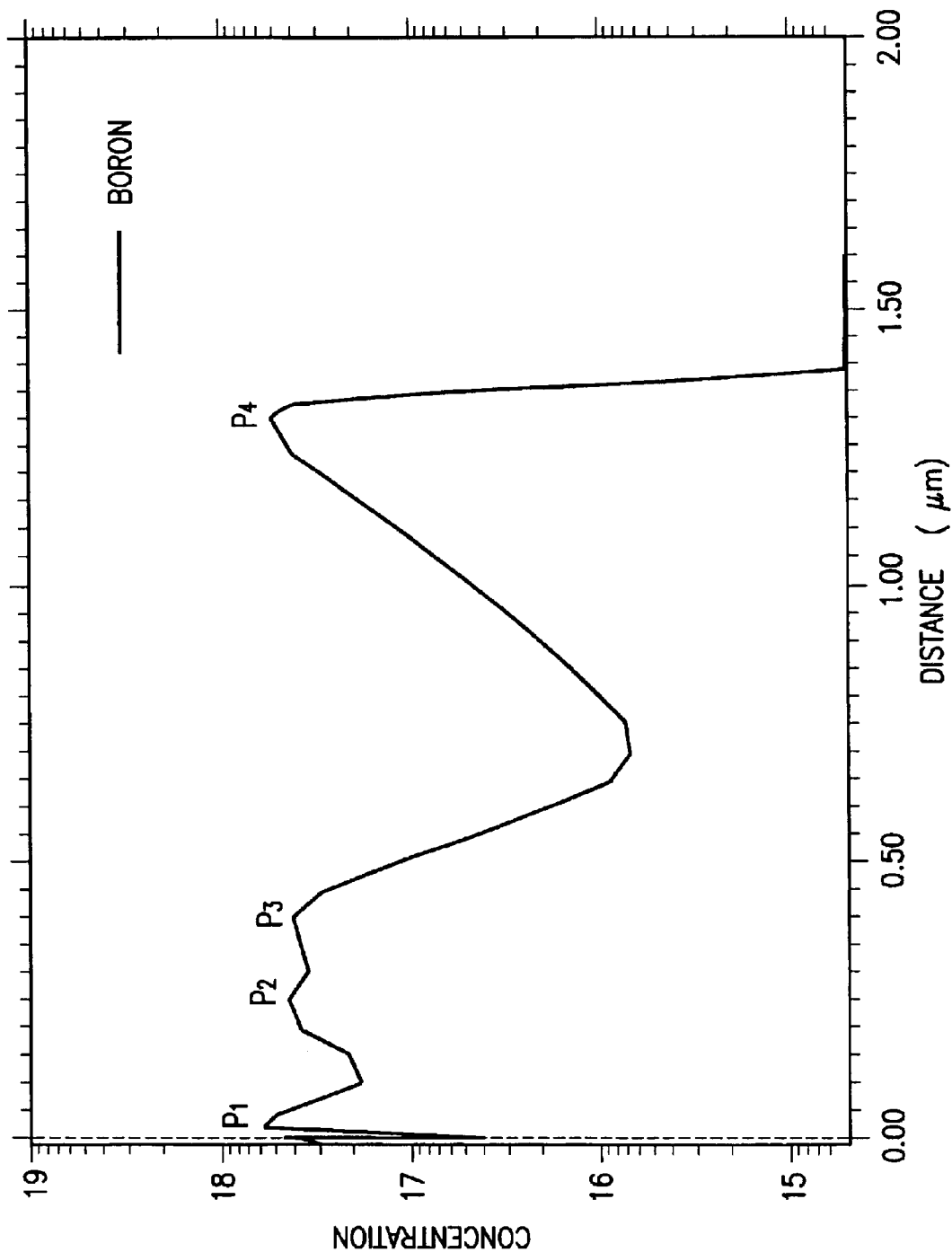
FIG. 11 shows the concentration of an implant in the well which is measured after the p-well formation area of the peripheral circuit area is ion-implanted four times, a gate oxidation layer is formed, and the polysilicon layer becoming a gate electrode is annealed.

FIG. 11 shows an implant concentration profile of the implant in the well which is measured after the polysilicon layer, which becomes a gate electrode with a gate oxidation layer formed, is annealed. The p-well has four concentration peaks ($P_1$, $P_2$, $P_3$, and $P_4$).

Figure 12:
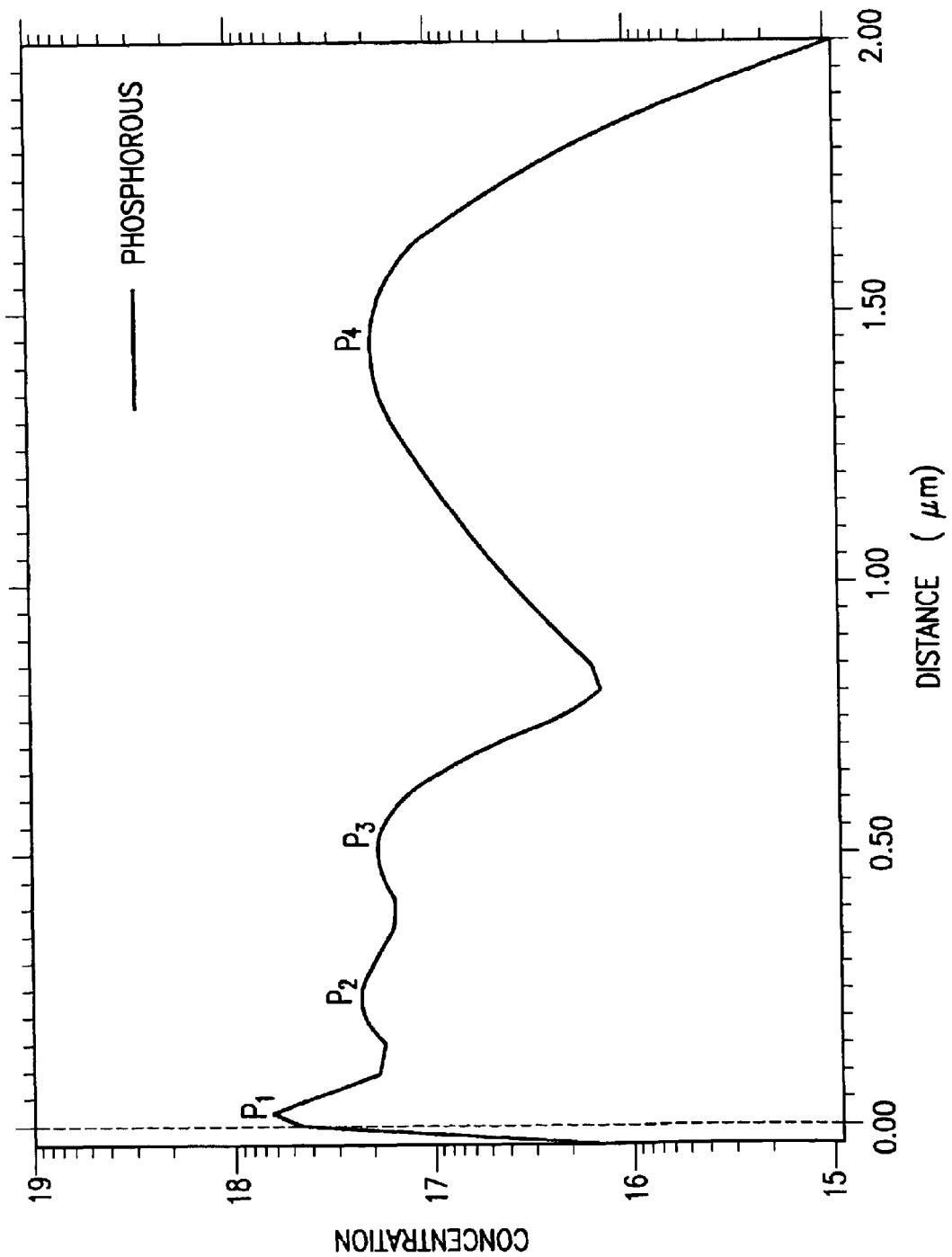
FIG. 12 is a graph showing the concentration of the implant in the well subsequent to a fourth ion implantation into the n-well formation area of the peripheral circuit area.
Figure 13:
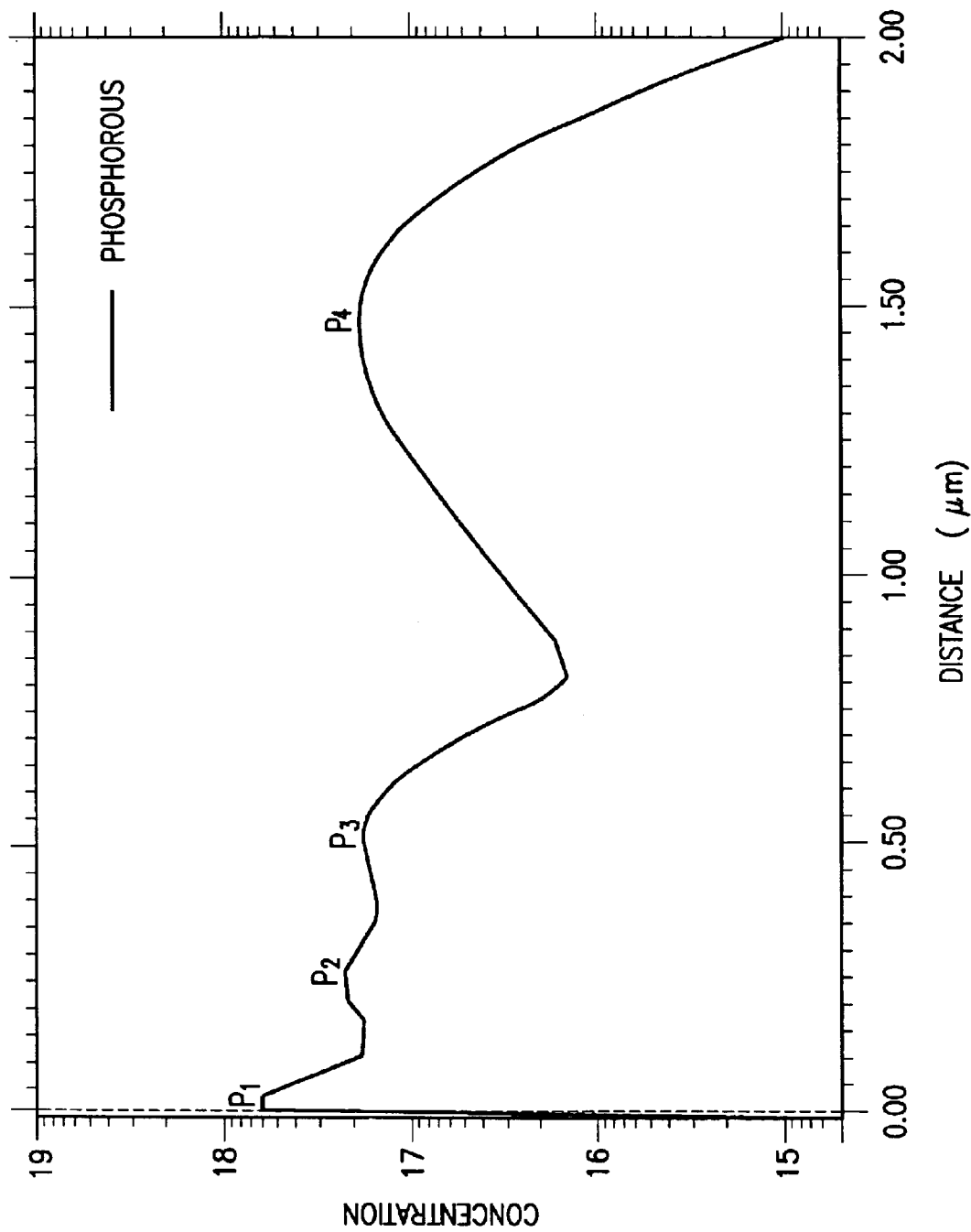
FIG. 13 shows the concentration of an implant in the well which is measured after the n-well formation area of the peripheral circuit area is ion-implanted four times, a gate oxidation layer is formed, and the polysilicon layer becoming a gate electrode is annealed.

FIG. 12 shows a concentration profile of the implant subsequent to a fourth ion implantation into the n-well formation area in the peripheral circuit area. In the peripheral circuit area, the n-well is formed by ion implantation that is performed four times with different implantation energies and doses. There are four concentration peaks ($P_1$, $P_2$, $P_3$, and $P_4$) in the direction of the depth of the well. FIG. 13 shows a concentration profile of the implant in the well which is measured after the polysilicon layer, which becomes a gate electrode with a gate oxidation layer formed, is annealed. The n-well has four concentration peaks ($P_1$, $P_2$, $P_3$, and $P_4$).

Figure 14:
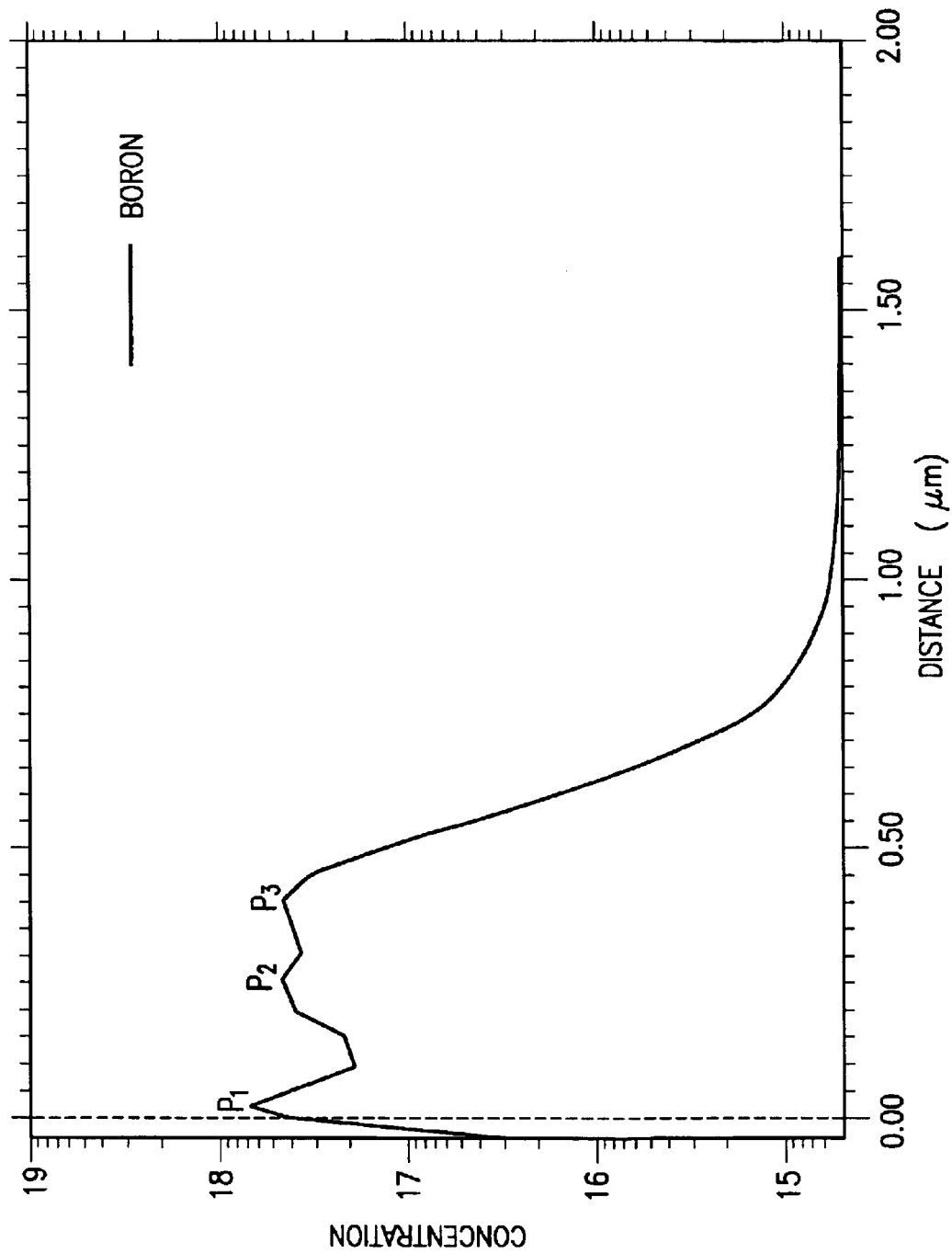
FIG. 14 is a graph showing the concentration of the implant in the well subsequent to a third ion implantation into the p-well formation area of the memory cell area.
Figure 15:
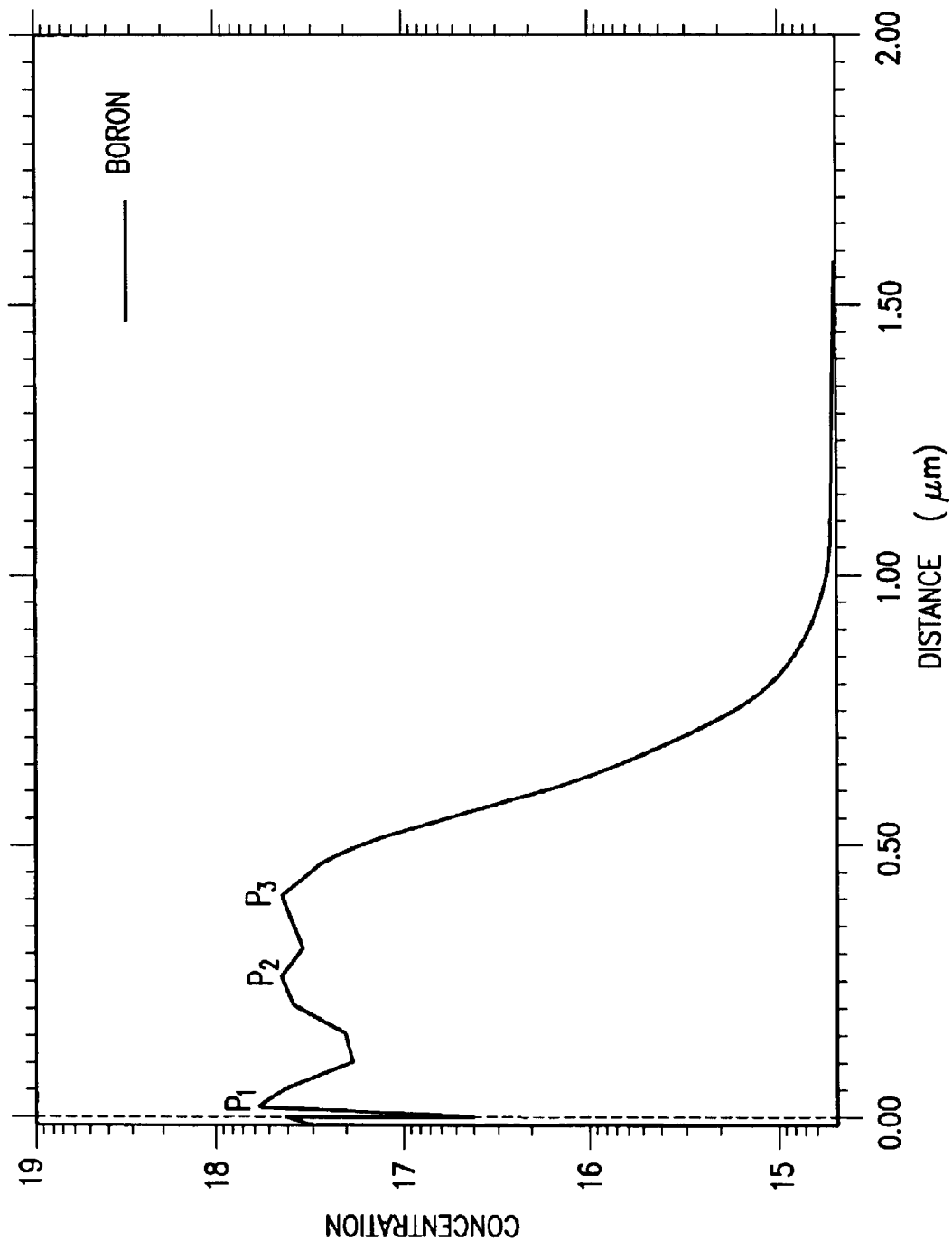
FIG. 15 shows the concentration of an implant in the well which is measured after the p-well formation area of the memory cell area is ion-implanted three times, a gate oxidation layer is formed, and the polysilicon layer becoming a gate electrode is annealed.

FIG. 14 shows a concentration profile of the implant in the well subsequent to a third ion implantation into the p-well formation area. In the memory cell area, the p-well is formed by ion implantation that is performed three times having different implantation energies and doses. There are three concentration peaks ($P_1$, $P_2$, and $P_3$) in the direction of the depth of the well. FIG. 15 shows a concentration profile of the implant in the well which is measured after the polysilicon layer, which becomes a gate electrode with a gate oxidation layer formed, is annealed. The p-well has three concentration peaks ($P_1$, $P_2$, and $P_3$).

Figure 16:
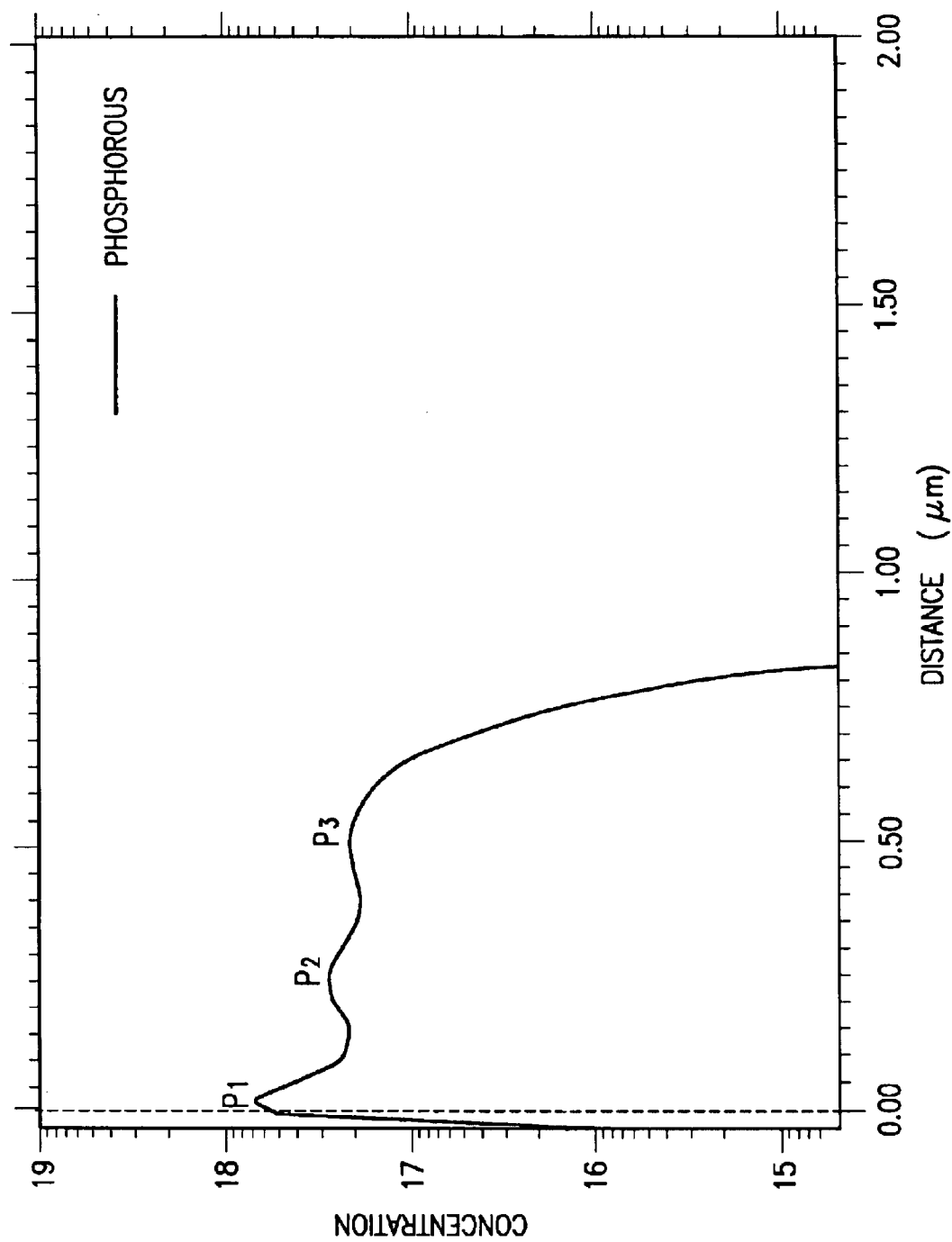
FIG. 16 is a graph showing the concentration of the implant in the well subsequent to a third ion implantation into the n-well formation area of the memory cell area.
Figure 17:
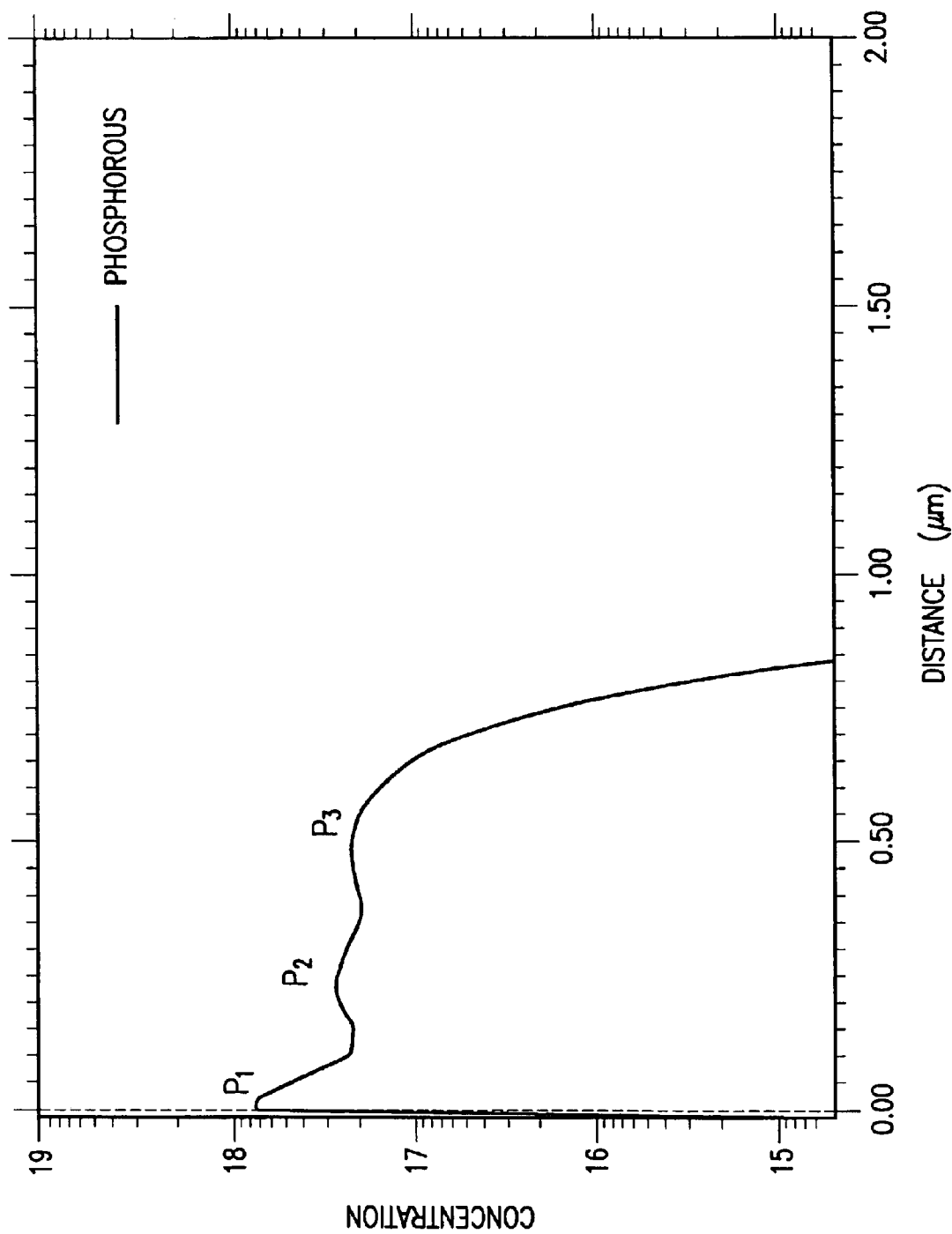
FIG. 17 shows the concentration of an implant in the well which is measured after the n-well formation area of the memory cell area is ion-implanted three times, a gate oxidation layer is formed, and the polysilicon layer becoming a gate electrode is annealed.
Figure 18:
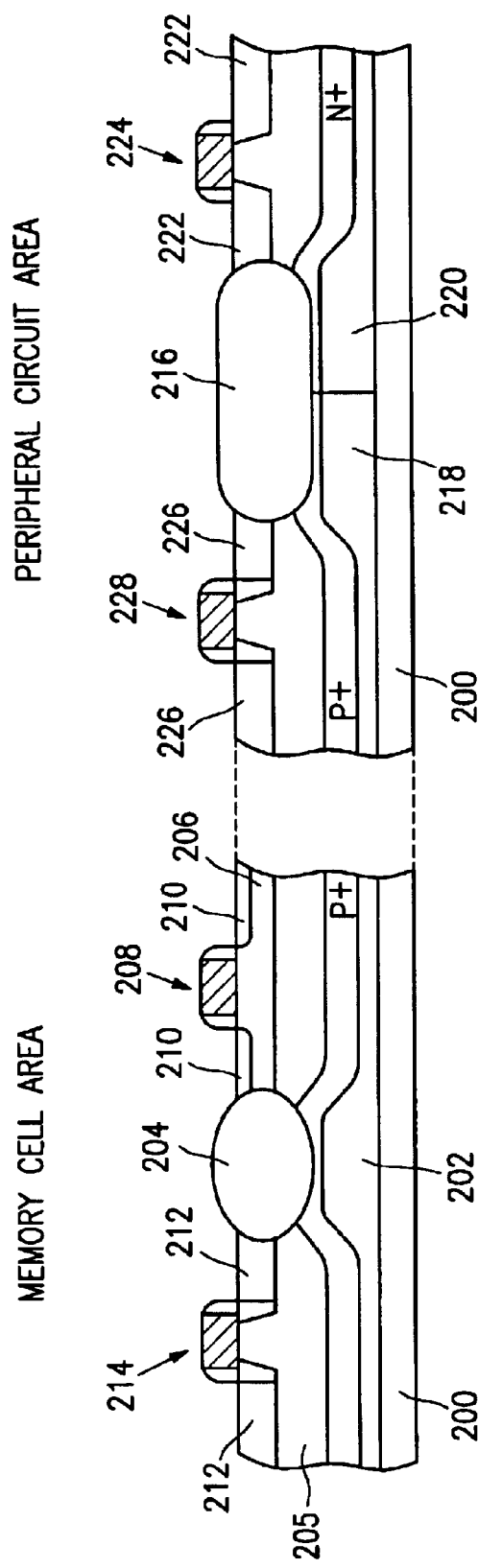
FIG. 18 is a cross-sectional view showing a memory cell area and a peripheral circuit area in a conventional SRAM.

FIG. 16 shows a concentration profile of the implant in the well subsequent to a third ion implantation into the n-well formation area in the memory cell area. In the memory cell area, the n-well is formed by ion implantation that is performed three times having different implantation energies and doses. There are three concentration peaks ($P_1$, $P_2$, and $P_3$) in the direction of the depth of the well. FIG. 17 shows a concentration profile of the implant in the well which is measured after the polysilicon layer, which becomes a gate electrode with a gate oxidation layer formed, is annealed. The n-well has three concentration peaks ($P_1$, $P_2$, and $P_3$).

In accordance with embodiments of the present invention, a semiconductor memory device has a memory cell area having a well depth shallower than that of a peripheral circuit area. As described below in greater detail, this arrangement reduces the possibility of generation of latchup, while shortening the length of the device isolation structure between the n-well and the p-well in the memory cell area.

More specifically, the latchup occurs when the product of a leakage current in a parasitic MOS transistor or a substrate current and the resistance of the substrate exceeds a certain value. To reduce the substrate resistance, a deep well needs to be formed. The thickness of the resist pattern is proportional to the depth of the well. For this reason, to form a deep well, the thickness of a resist pattern has to be increased.

If a deep well is formed with a thick resist pattern, the n-well 42 and the p-well 44 overlap each other in a large area beneath the semi-recessed LOCOS oxidation layer 46, as shown in FIG. 1. The reason for this is discussed with reference to FIG. 7.

Figure 7:
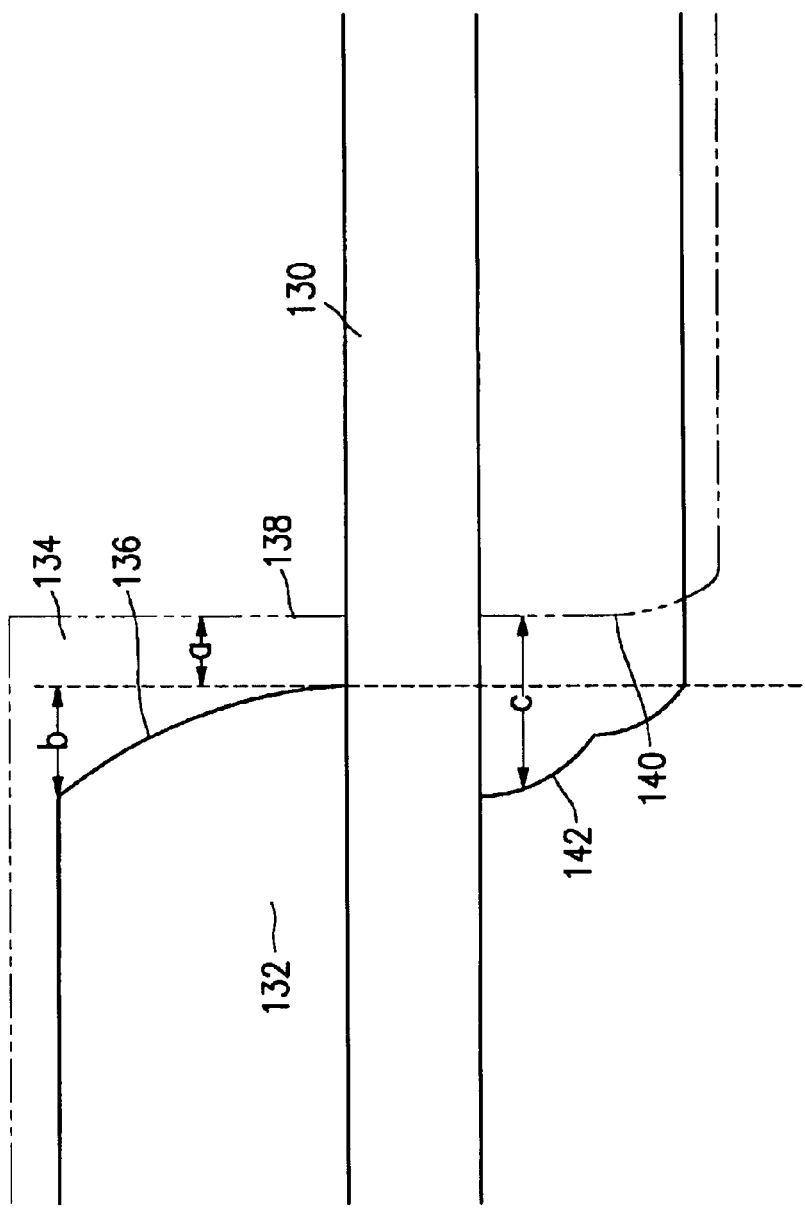
FIG. 7 is a cross-sectional view showing a change in configuration of a resist pattern.

FIG. 7 shows a state in which a resist pattern 132 is formed over a device isolation structure 130. FIG. 7 shows a resist end portion 136, namely, an end portion of the resist pattern 132. FIG. 7 also shows a designed resist pattern 134 having a designed resist end portion 138.

The letter a represents a receding distance due to the proximity effect and loading effect. The letter b represents a shrinkage at the upper edge of the resist when the resist pattern is baked. The top edge of the resist end portion 136 recedes by an amount of a+b from the resist end portion 138.

Reference numeral 140 denotes a well end portion if the well is to be formed with the designed resist pattern 134 as a mask. Reference numeral 142 denotes a well end portion when the well is actually formed with the resist pattern 132 as a mask. The upper edge of the well end portion 142 advances by an amount c from the upper edge of the well end portion 140 under the influence of the recession of the top edge of the resist end portion 136. This increases the intrusion of ions into the adjacent well, thereby expanding the overlapped area. The effect of this expanded overlapped area is discussed referring to FIG. 8.

Figure 8:
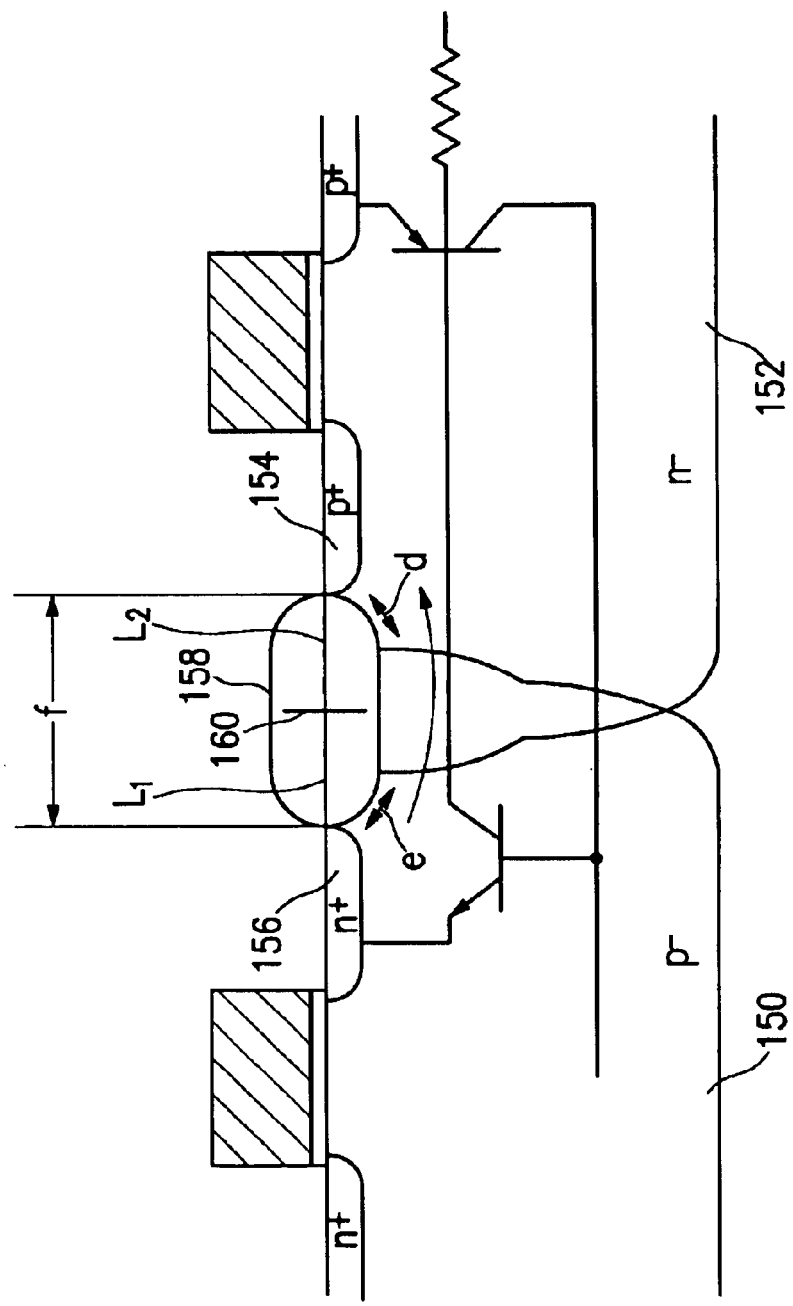
FIG. 8 is a cross-sectional view to illustrate a latchup phenomenon.

When a p-well 150 and an n-well 152 overlap each other in a large area as shown in FIG. 8, the one or the both of the distance d between a p-type source/drain 154 and the p-well 150 and the distance e between an n-type source/drain 156 and the n-well 152 is shortened depending on the amount of ion implantation dose during the well formation. When this distance shortens, for example, when the distance e shortens, a leakage current of a parasitic MOS transistor tends to flow to the n-well 152 from the n-type source/drain 156 through the p-well 150. This is attributable to a shortened effective channel length of the parasitic MOS transistor. The leakage current in the parasitic MOS transistor may work as a trigger current for latchup.

If a well is formed using a thin resist pattern, for example, having a thickness of 2 µm or less, the overlapped area is made relatively small. This is because neither the receding distance a at the resist end portion nor the shrinkage b at the top end edge of the resist occur in the end portion of the resist pattern.

When the length f of the device isolation structure 158 is made greater, the distances d and e may not become shorter. In the peripheral circuit area having space margin available, the length f of the device isolation structure may be made greater. However, if the length f of the device isolation structure is made greater in the memory cell area where no additional space is available, miniaturization of the memory cell may not be achieved.

The substrate current is relatively large in the peripheral circuit area, because a transistor having a wide channel width and a large driving power is arranged in the peripheral circuit area. To prevent latchup, the substrate resistance needs to be reduced. For this reason, the well depth has to be increased in the peripheral circuit area. On the other hand, the substrate current is relatively small in the memory cell area, because the size of a transistor constituting a memory cell is small. The latchup is controlled without greatly reducing the substrate resistance. A shallow well depth of the memory cell area is thus acceptable.

For the reasons discussed above, the well depth is set to be shallow in the memory cell area. In this way, the p-well and the n-well are overlapped in a small region, reducing the possibility of the generation of latchup.

Experiments are conducted to demonstrate the advantages described above. For example, a deep well (as deep as 2.0 µm) is formed, and a plurality of samples of semi-recessed LOCOS oxidation layers having different lengths and a shallow well (as shallow as 0.8 µm) are formed, and a plurality of samples of semi-recessed LOCOS oxidation layers having different lengths are prepared. The well formation conditions are shown in Table 1 below. The thickness of the semi-recessed LOCOS oxidation layer is 0.4 µm.

TABLE 1

| | | Photo-resist thickness | Deep well A 3.8 µm | Deep well B 3.8 µm | Shallow well 2.0 µm |
|---|---|---|---|---|---|
| N-well | (1) Low-resistance layer | | P 1.2 MeV 1E13 | P 1.2 MeV 1E13 | |
| | (2) Channel cut layer | | P 360 keV 4E12 | P 360 keV 6E12 | P 360 keV 6E12 |
| | (3) Punch-through stopper layer | | P 180 keV 2E12 | P 180 keV 2E12 | P 180 keV 2E12 |
| | (4) Channel doped layer | | BF$_2$ 70 keV 6E12 | BF$_2$ 70 keV 6E12 | BF$_2$ 70 keV 6E12 |
| P-well | (1) Low-resistance layer | | B 700 keV 1E13 | B 700 keV 1E13 | |

TABLE 1-continued

| | Photo-resist thickness | Deep well A 3.8 µm | Deep well B 3.8 µm | Shallow well 2.0 µm |
|---|---|---|---|---|
| | (2) Channel cut layer | B 150 keV 4E12 | B 150 keV 8E12 | B 150 keV 8E12 |
| | (3) Punch-through stopper layer | B 80 keV 4E12 | B 80 keV 8E12 | B 80 keV 8E12 |
| | (4) Channel doped layer | BF$_2$ 70 keV 3.5E12 | BF$_2$ 70 keV 3.5E12 | BF$_2$ 70 keV 3.5E12 |

Leakage currents in these samples are measured. The measuring conditions are as follows. Currents flowing from an n-well into a source of an n-channel transistor are measured under the conditions of an n-well potential of 5 V and a p-well potential of 0 V with the source of the n-channel transistor at 0 V and a drain of the n-channel transistor at 5 V, and a gate of the n-channel transistor at 5 V. Currents flowing from the p-well into the source of a p-channel transistor are measured under the conditions of an n-well potential of 5 V and a p-well potential of 0 V with the source of the p-channel transistor at 5 V, a drain of the p-channel transistor at 0 V, and a gate of the p-channel transistor at 0 V.

Figure 9:
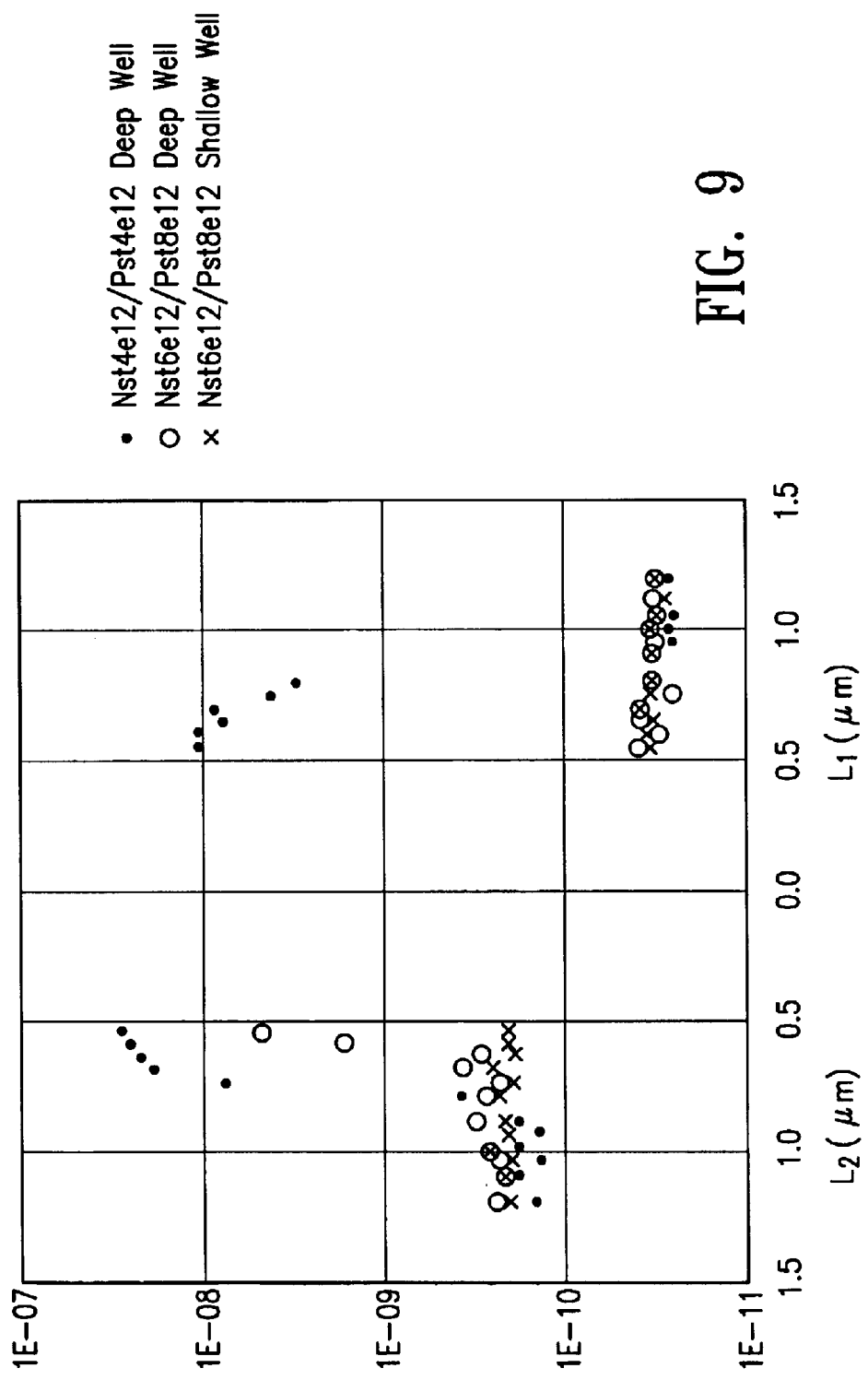
FIG. 9 is a graph showing the relationship between the depth of a well and a leakage current.

FIG. 9 shows the measurement results. Solid circles represent data of a deep well A, blank circles represent data of a deep well B, and crosses (x) represent data of a shallow well. Before discussing the measurement results, the definitions of distances $L_1$ and $L_2$ are discussed first. Referring to FIG. 8, let us assume a vertical line segment 160 running transversely across the device isolation structure 158 at a center thereof. $L_1$ represents the distance from the vertical line segment 160 to the n-type source/drain 156, and $L_2$ represents the distance from the vertical line segment 160 to the p-type source/drain 154. For example, with either $L_1$ or $L_2$ being 0.5 µm, the length of the semi-recessed LOCOS oxidation layer is 1.0 µm.

Referring to FIG. 9, even with the distance being close to 0.5 µm in the shallow wells of p-type and n-type, the level of leakage currents is relatively lower than those of the deep wells. This shows that, when the well depth in the memory cell area is shallower than the well depth in the peripheral circuit area, the leakage current of the parasitic MOS transistor does not increase, and thus the possibility of generation of latchup is lower even when the length of the semi-recessed LOCOS oxidation layer is shortened in the memory cell area, compared to a structure in which the well depth in the memory cell area is generally equal to the well depth in the peripheral circuit area.

The present invention provides further advantages as described below.

Referring to FIG. 1, the depth of the n-well 16 is generally equal to the depth of the p-well 18 in this embodiment. Substantially no imbalance in performance between transistors, attributable to the difference between the well depths, occurs in the memory cell area 12.

Referring to FIG. 1, the p-well 18 is formed down to a level lower than the semi-recessed LOCOS oxidation layer 40 in this embodiment. This arrangement allows the p-well 18 to extend to the well contact region 38. The p-well 18 is thus easily connected to the well contact region 38. In this construction, the well contact of the memory cell area can be arranged on a 32-bit basis (i.e., each interval at 32 bits), rather than on a per memory cell basis (i.e., at each memory cell). The area required for the well contact is thus reduced. This is also true to the n-well 16.

Referring to FIG. 1, the n-well 16 and the p-well 18 are formed down to a level lower than the semi-recessed LOCOS oxidation layers 20 and 40 in this embodiment. This arrangement prevents the sources 26 and 34 and the drains 28 and 36 from becoming too shallow.

Referring to FIG. 1, in this embodiment, the depths of the source 26 and the drain 28, formed in the n-well 16, are generally equal to the depths of the source 34 and the drain 36, formed in the p-well 18. Substantially no imbalance in performance between transistors, attributable to the difference between the source and drain depths, occurs in the memory cell area 12.

Referring to FIG. 1, in this embodiment, each of the memory cell area 12 and the peripheral circuit area 14 has a twin-well structure. For this reason, after the low-resistance layer is formed in areas that become the n-well 42 and the p-well 44, the channel cut layer, the punch-through stopper layer and the channel doped layer are concurrently formed on areas that become the n-well 16 and the n-well 42. Also, the channel cut layer, the punch-through stopper layer and the channel doped layer are concurrently formed on areas that become the p-well 18 and the p-well 44. Accordingly, the method in accordance with the embodiment of the present invention simplifies the manufacturing process.

Referring to FIG. 1, the depths of the source 26 and the drain 28 formed in the n-well 16, the depths of the source 34 and the drain 36 formed in the p-well 18, the depths of the source/drain 52 and 54 formed in the n-well 42, and the depths of the source/drain 60 and 62 formed in the p-well 44 are generally equal to one another. For this reason, the source 26, the drain 28 and the source/drain 52 and 54 are produced at the same time. Also, the source 34, the drain 36 and the source/drain 60 and 62 are produced at the same time. This simplifies the manufacturing process.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor memory device having a semiconductor substrate, and a peripheral circuit area and a memory cell area defined on a main surface of the semiconductor substrate, comprising:
    a first well formed in the peripheral circuit area and having a specified depth;
    a second well of a first conductivity type, formed in the memory cell area, and having a depth shallower than the depth of the first well;
    a third well of a second conductivity type, formed in the memory cell area, and being generally equal in depth to the second well; and
    a device isolation structure, formed in the memory cell area, for isolating a device element formed in the second well from a device element formed in the third well
    wherein the second and third wells are formed down to a level lower than the device isolation structure,
    wherein, each of the first, second and third wells comprises, in the order from above, a first-concentration layer, a second-concentration layer and a third-concentration layer, and
    wherein the first well further comprises a fourth-concentration layer beneath the third-concentration layer.

2. A semiconductor memory device according to claim 1, wherein the depths of source/drain of a transistor formed in the second well are generally equal to the depths of source/drain of a transistor formed in the third well.

3. A semiconductor memory device according to claim 1, wherein the depths of source/drain of a transistor formed in the first well the depths of source/drain of a transistor formed in the second well, and the depths of source/drain of a transistor formed in the third well are generally equal to one another.

4. A semiconductor memory device according to claim 1, wherein the first, second and third wells are retrograded wells.

5. A semiconductor memory device according to claim 4, wherein, each of the first, second and third wells comprises, in the order from above, a first-concentration layer, a second-concentration layer and a third-concentration layer, and wherein the first well further comprises a fourth-concentration layer beneath the third-concentration layer.

6. A semiconductor memory device according to claim 1, wherein a CMOS cell type SRAM is formed in the memory cell area.

7. A semiconductor memory device according to claim 1, wherein the first well comprises twin wells composed of a first conductivity type well and a second conductivity type well.

8. A semiconductor memory device according to claim 1, wherein the second and third wells have respective well contact regions for fixing well potentials.

9. A semiconductor memory device according to claim 1, wherein the second well has a first well contact region that is adapted to be coupled to a ground line.

10. A semiconductor memory device according to claim 1, wherein a source region of a transistor formed in the third well is adapted to be coupled to a ground line.

11. A semiconductor memory device according to claim 1, wherein a drain region of a transistor formed in the second well is adapted to be coupled to a bit line.

12. A semiconductor memory device according to claim 1, wherein the length of the device isolation structure falls in a range of about 0.2 $\mu$m to about 1.6 $\mu$m.

13. A semiconductor memory device according to claim 1, wherein the depth of each of the second and third wells falls within a range of about 0.5 $\mu$m to about 1.2 $\mu$m.

14. A semiconductor memory device having a semiconductor substrate, and a peripheral circuit area and a memory cell area defined on a main surface of the semiconductor substrate, comprising:
    two first wells formed in the peripheral circuit area;
    a second well of a first conductivity type, formed in the memory cell area;
    a third well of a second conductivity type, formed in the memory cell area;
    a first device isolation structure formed in the peripheral circuit area between the two first wells; and
    a second device isolation structure formed in the memory cell area for isolating a device element formed in the second well from a device element formed in the third well
    wherein the length of the first device isolation structure is longer than that of the device isolation structure in the memory cell area, the depths respectively of the second well and the third well being shallower than the depths of the two first wells, wherein, each of the first, second and third wells comprises, in the order from above, a first-concentration layer, a second-concentration layer and a third-concentration layer, and wherein the first well further comprises a fourth-concentration layer beneath the third-concentration layer.

15. A semiconductor memory device having a semiconductor substrate, and a peripheral circuit area and a memory cell area defined on a main surface of the semiconductor substrate, comprising:

a first well farmed in the peripheral circuit area and having a specified depth;

a second well of a first conductivity type, formed in the memory cell area and having a depth shallower than the depth of the first well;

a third well of a second conductivity type, formed in the memory cell area, and being generally equal in depth to the second well; and a device isolation structure, formed in the memory cell area for isolating a device element formed in the second well from a device element formed in the third well, wherein the second and third wells are formed down to a level lower than the device isolation structure, wherein the length of the device isolation structure falls in a range of about 0.2 $\mu$m to about 1.6 $\mu$m, wherein, each of the first, second and third wells comprises, in the order from above, a first-concentration layer, a second-concentration layer and a third-concentration layer, and wherein the first well further comprises a fourth-concentration layer beneath the third-concentration layer.

* * * * *